(12) United States Patent
Lee et al.

(10) Patent No.: US 7,812,505 B2
(45) Date of Patent: Oct. 12, 2010

(54) PIEZOELECTRIC MICROSPEAKER USING MICROELECTROMECHANICAL SYSTEMS AND METHOD OF MANUFACTURING THE SAME

(75) Inventors: Sang Kyun Lee, Gwangju (KR); Sung Q Lee, Daejeon (KR); Hye Jin Kim, Daejeon (KR); Jae Woo Lee, Daejeon (KR); Kang Ho Park, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 116 days.

(21) Appl. No.: 12/240,138

(22) Filed: Sep. 29, 2008

(65) Prior Publication Data

US 2009/0146527 A1    Jun. 11, 2009

(51) Int. Cl.
*H01L 41/08* (2006.01)
*C03C 15/00* (2006.01)

(52) U.S. Cl. .................. 310/324; 310/365; 216/41
(58) Field of Classification Search ........... 310/324, 310/328, 365; 216/41, 48, 94
See application file for complete search history.

(56) References Cited

U.S. PATENT DOCUMENTS

| | | | | |
|---|---|---|---|---|
| 3,418,436 | A * | 12/1968 | Neumann | 381/174 |
| 4,783,821 | A * | 11/1988 | Muller et al. | 381/173 |
| 4,816,125 | A * | 3/1989 | Muller et al. | 204/192.18 |
| 4,885,781 | A * | 12/1989 | Seidel | 381/351 |
| 6,668,190 | B2 * | 12/2003 | Iezzi et al. | 604/20 |
| 6,924,584 | B2 * | 8/2005 | Buhler et al. | 310/324 |
| 7,089,638 | B2 | 8/2006 | Yi et al. | |
| 7,301,212 | B1 * | 11/2007 | Mian et al. | 257/415 |
| RE40,781 | E * | 6/2009 | Johannsen et al. | 381/174 |
| 2003/0048914 | A1 * | 3/2003 | Yi et al. | 381/190 |
| 2005/0213785 | A1 | 9/2005 | Koura et al. | |
| 2005/0248238 | A1 * | 11/2005 | Yamada et al. | 310/366 |
| 2006/0284516 | A1 * | 12/2006 | Shimaoka et al. | 310/322 |
| 2007/0090731 | A1 * | 4/2007 | Namba et al. | 310/359 |

FOREIGN PATENT DOCUMENTS

| | | | |
|---|---|---|---|
| JP | 8-084396 | * | 3/1996 |
| JP | 2005-051689 A | | 2/2005 |
| KR | 1020040011035 A | | 2/2004 |
| KR | 1020060093464 A | | 8/2006 |
| KR | 1020070082087 A | | 8/2007 |
| WO | WO2007/078646 A1 | | 7/2007 |

OTHER PUBLICATIONS

Eunki Hong et al., "Micromachined piezoelectric diaphragms actuated by ring shaped interdigitated transducer electrodes", 2004 Elsevier B.V., Sensors and Actuators A 119 (2005) pp. 520-526.

* cited by examiner

*Primary Examiner*—Thomas M Dougherty

(57) ABSTRACT

A piezoelectric microspeaker using microelectromechanical systems (MEMS) and a method of manufacturing the same are provided. The piezoelectric microspeaker includes a piezoelectric layer disposed on an elastic thin layer, and a resonance change unit patterned on one of a bottom surface of the elastic thin layer and a top surface of the piezoelectric layer.

13 Claims, 3 Drawing Sheets

PIEZOELECTRIC MICROSPEAKER USING MICROELECTROMECHANICAL SYSTEMS AND METHOD OF MANUFACTURING THE SAME

CROSS-REFERENCE TO RELATED APPLICATION

This application claims priority to and the benefit of Korean Patent Application No. 2007-126788, filed Dec. 7, 2007, the disclosure of which is incorporated herein by reference in its entirety.

BACKGROUND

1. Field of the Invention

The present invention relates to a piezoelectric microspeaker using microelectromechanical systems (MEMS) and a method of manufacturing the same and, more particularly, to a piezoelectric microspeaker manufactured using MEMS technology, in which a resonance frequency is changed in an audible frequency band, and a method of manufacturing the same.

This work was supported by the IT R&D programs of MIC/IITA. [2006-S-006-02, Components/Module technology for Ubiquitous Terminals]

2. Discussion of Related Art

Conventionally, methods of forming a small-sized microphone and a small-sized microspeaker on a silicon wafer using microelectromechanical systems (MEMS) technology have been disclosed. In these methods, since an acoustic transducer can be manufactured on a silicon wafer at one time, the manufacturing cost can be reduced. Also, a plurality of transducers and a plurality of amplifiers can be scaled down and integrated on a single chip so that a lot of advantages can be obtained as compared with conventional methods.

However, in a transducer manufactured using piezoelectric MEMS, since a diaphragm has residual tensile stress, a microphone has a relatively low sensitivity, while a microspeaker has a low output. Also, owing to miniaturization of the diaphragm, a plurality of resonance frequencies are included in an audible frequency band.

In addition to a compression diaphragm, tensile stress may be minimized using a wrinkling or hinge structure. However, manufacture of the wrinkling or hinge structure in MEMS using a semiconductor process takes additional costs. Therefore, it is necessary to develop a microspeaker that lowers production costs and makes no noise in an audible frequency band.

SUMMARY OF THE INVENTION

The present invention is directed to a microspeaker, which is easy to manufacture, reduces an abrupt fluctuation of power output, lowers a power output volume, and minimizes noise caused by a resonance frequency, and a method of manufacturing the same.

One aspect of the present invention is to provide a piezoelectric microspeaker using microelectromechanical systems (MEMS). The piezoelectric microspeaker includes: a piezoelectric layer disposed on an elastic thin layer; and a resonance change unit patterned on one of a bottom surface of the elastic thin layer and a top surface of the piezoelectric layer.

The elastic thin layer may be formed of one selected from the group consisting of silicon, silicon oxide, and silicon nitride. Also, the piezoelectric layer may be bonded to the elastic thin layer using an epoxy adhesive or deposited on the elastic thin layer using a sol-gel technique. The piezoelectric layer may be a single layer formed of one selected from the group consisting of PZT, PMN-PT, PVDF, ZnO, AlN, and a lead-free piezoelectric material. Alternatively, the piezoelectric layer may be a multiple layer including a Ti layer, a Pt layer, a PZT layer, and a Pt layer.

The resonance change unit disposed under the elastic thin layer may be patterned by etching a Si layer formed under the elastic thin layer. Also, the resonance change unit may be patterned in order to change a resonance frequency caused by the piezoelectric layer from an audible frequency band to an inaudible frequency band. Furthermore, the resonance change unit may be patterned using one of a deep reactive ion etching (DRIE) dry etching technique and an anisotropic Si etching technique.

Another aspect of the present invention is to provide a method of manufacturing a piezoelectric microspeaker using MEMS. The method includes: depositing an elastic thin layer, a piezoelectric layer, and an electrode on a silicon substrate; and forming a predetermined pattern by etching a lower portion of the silicon substrate.

The depositing of the elastic thin layer, the piezoelectric layer, and the electrode may include: depositing an elastic thin layer on the silicon substrate; forming a lower electrode on the elastic thin layer; forming a piezoelectric layer on the lower electrode; forming an insulating layer on the piezoelectric layer; and forming an upper electrode on the insulating layer. Alternatively, the depositing of the elastic thin layer, the piezoelectric layer, and the electrode may include: depositing an elastic thin layer on the silicon substrate; coating an adhesive on the elastic thin layer; forming a piezoelectric layer on the coated adhesive; and forming an interdigitated electrode on the piezoelectric layer.

The silicon substrate may be etched using one of a deep reactive ion etching (DRIE) dry etching technique and a potassium hydroxide (KOH) wet etching technique in the forming the predetermined pattern. Also, the silicon substrate may be etched at least twice in the forming the predetermined pattern.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

A piezoelectric microspeaker using microelectromechanical systems (MEMS) according to the present invention will be described more fully hereinafter with reference to the accompanying drawings, in which exemplary embodiments of the invention are shown.

Figure 1:
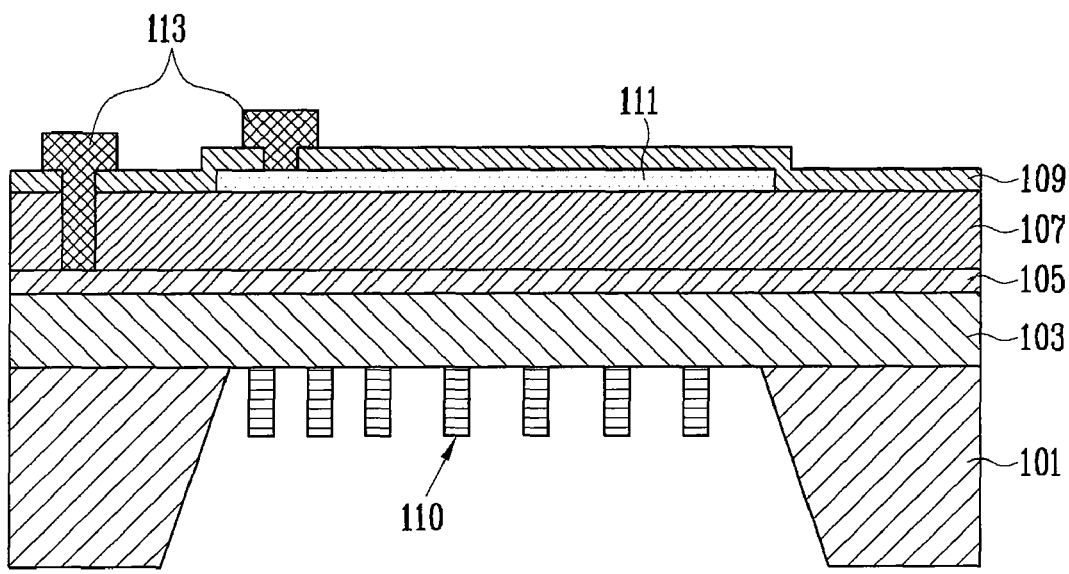
FIG. 1 is a cross-sectional view of a piezoelectric microspeaker according to an exemplary embodiment of the present invention.

FIG. 1 is a cross-sectional view of a piezoelectric microspeaker according to an exemplary embodiment of the present invention.

Referring to FIG. 1, the piezoelectric microspeaker includes a silicon substrate 101, an elastic thin layer 103, a lower electrode layer 105, a piezoelectric layer 107, a blocking layer 109, an upper electrode layer 111, and upper and lower electrodes 113. Also, the piezoelectric microspeaker further includes a resonance change unit 110.

The piezoelectric microspeaker shown in FIG. 1 has the same construction as a conventional piezoelectric microspeaker having upper and lower electrodes except for the resonance change unit 110.

Specifically, the silicon substrate 101 functions as a base in manufacturing the microspeaker using a MEMS process and is etched for oscillation of a piezoelectric device during a final process.

The elastic thin layer 103 is typically formed of a silicon compound and functions as an etch stop layer during the etching of the silicon substrate 101.

The lower electrode layer 105 functions as a lower electrode that transmits an electrical signal to the piezoelectric device in the piezoelectric microspeaker.

The piezoelectric layer 107, which is one of the most essential portions of the piezoelectric microspeaker, includes the piezoelectric device that converts the electrical signal into a physical oscillation signal.

The blocking layer 109 is an insulating layer that prevents direct connection between the lower electrode layer 105 for transmitting the electrical signal to the piezoelectric device and the upper electrode layer 111.

The upper electrode layer 111 is disposed on the piezoelectric layer 107 to transmit the electrical signal to the piezoelectric device.

The upper and lower electrodes 113 are directly connected to the upper and lower electrode layers 111 and 105 and function to transmit an externally applied electrical signal to the upper and lower electrode layers 111 and 105.

By use of a MEMS process, the piezoelectric microspeaker using the upper and lower electrodes 113 according to the present invention can be produced in large quantities and scaled down. However, as mentioned in the background of the invention, resonance frequencies are included in an audible frequency band so that the piezoelectric microspeaker according to the present invention has poorer sound quality than other speakers.

In this case, the silicon substrate 101 is etched to leave the resonance change unit 110 to thereby change the resonance frequency.

The resonance change unit 110 is a protrusion structure disposed in a portion of the silicon substrate 101 that is etched to leave a thin oscillation layer of the microspeaker. The resonance change unit 110 may be formed by leaving the silicon during the etching of the silicon substrate 101. Alternatively, the resonance change unit 110 may be formed of an additional material after the etching of the silicon substrate 101.

However, in order to simplify the entire process and reduce production costs, the protrusion structure of the resonance change unit 110 may be patterned by etching the silicon substrate 101.

The resonance change unit 110 leaves a stiff protruding pattern on a diaphragm of the piezoelectric device and varies the stiffness and mass of the diaphragm to change the resonance frequency. The resonance frequency is expressed as in Equation 1:

$$f_{m+p}^2 \sim \frac{1}{(2\pi r)^2}\left(\frac{\alpha_p^2}{r^2}D_E + \alpha_m^2 T\right), D_E = \frac{Eh^3}{12(1-v^2)}, \quad (1)$$

wherein $f_{m+p}$ denotes the resonance frequency, $a_p$ denotes an oscillation constant of the diaphragm of the piezoelectric device, $a_m$ denotes an oscillation constant of the elastic thin layer, "r" denotes a radius of the diaphragm of the piezoelectric device, "h" denotes the thickness of the diaphragm of the piezoelectric device, E denotes Young's modulus, "v" denotes Poisson's ratio, and T denotes the modulus of elasticity of the elastic thin layer.

As can be seen from Equation 1, the resonance frequency $f_{m+p}$ depends on the oscillation constant $a_m$ of the elastic thin layer and the thickness "h" of the diaphragm of the piezoelectric device. When the thickness "h" of the diaphragm of the piezoelectric device is increased, an output and an output bandwidth are reduced.

Accordingly, it is necessary to minimize the resonance frequency $f_{m+p}$ within the audible frequency band by changing the oscillation constant $a_m$ of the elastic thin layer.

However, when the resonance change unit 110 having a protrusion shape is formed under the thin layer as described above, a frequency band can be increased and a sound output can be made uniform.

The following table shows the comparison results of resonance frequencies of a conventional voice coil speaker, a plate microspeaker without a resonance change unit, and a microspeaker having a resonance change unit according to the present invention.

TABLE 1

|  | Plate microspeaker | Microspeaker having resonance change unit | Voice coil speaker |
| --- | --- | --- | --- |
| 1st NF | 453.60 Hz | 501.42 Hz | 1066.6 Hz |
| 2nd | 1781.0 | 2881.2 | 4159.9 |
| 3rd | 4018.0 | 7338.6 | 4159.9 |
| 4th | 7159.7 | 13808. | 21625. |
| 5th | 11206. | | |
| 6th | 16156. | | |

As can be seen from Table 1, the plate microspeaker includes 6 resonance frequencies in an audible frequency band of 20 to 20000 Hz, while the microspeaker having a resonance change unit according to the present invention includes only 4 resonance frequencies in the same audible frequency band. Especially, as compared with the conventional voice coil speaker, it can be seen that the microspeaker having a resonance change unit according to the present invention exhibited better characteristics.

Figure 2:
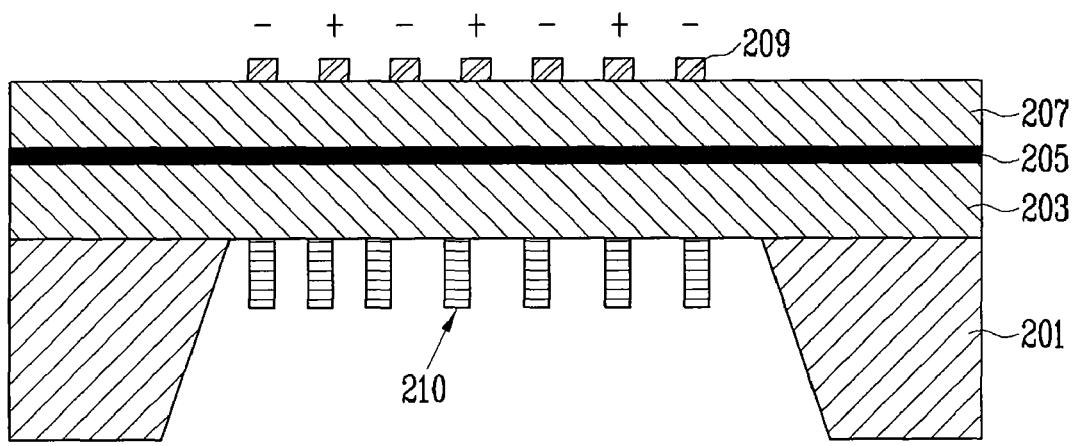
FIG. 2 is a cross-sectional view of a piezoelectric microspeaker according to another exemplary embodiment of the present invention.

FIG. 2 is a cross-sectional view of a piezoelectric microspeaker using an interdigitated electrode according to another exemplary embodiment of the present invention.

Referring to FIG. 2, the piezoelectric microspeaker includes a silicon substrate 201, an elastic thin layer 203, an adhesive layer 205, a piezoelectric layer 207, an interdigitated electrode 209, and a resonance change unit 210.

The piezoelectric microspeaker using an interdigitated electrode is a microspeaker according to an exemplary embodiment of the present invention, in which the thickness of the piezoelectric layer is reduced to make a diaphragm more flexible to make up for defects of the microspeaker having the upper and lower electrodes shown in FIG. 1.

In particular, since the piezoelectric microspeaker using the interdigitated electrode is characterized by thinning the diaphragm, the effects of the resonance change unit 210 according to the present invention can be enhanced.

Figure 3:
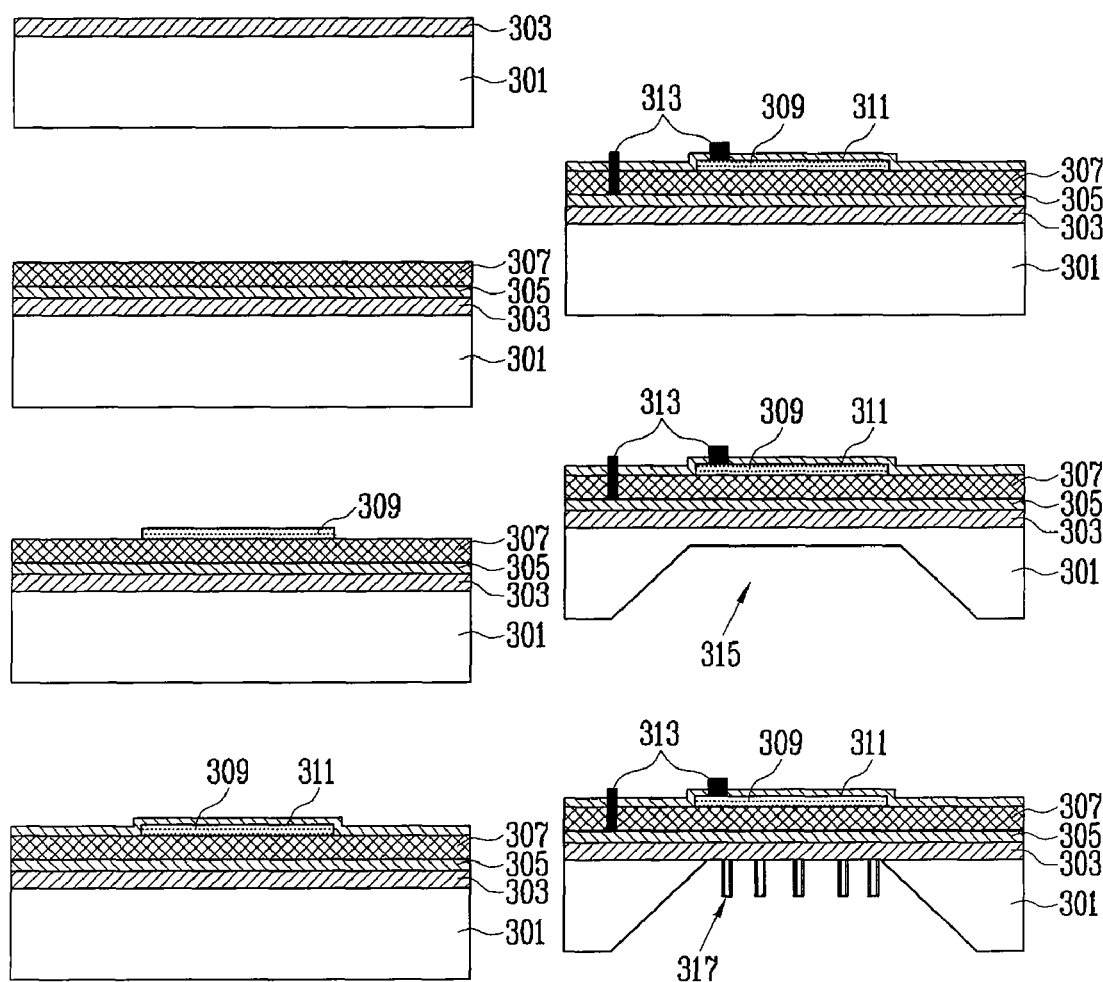
FIG. 3 illustrates a method of manufacturing a piezoelectric microspeaker using upper and lower electrodes according to an exemplary embodiment of the present invention.

FIG. 3 illustrates a method of manufacturing a piezoelectric microspeaker using upper and lower electrodes according to an exemplary embodiment of the present invention.

Referring to FIG. 3, an elastic thin layer 303 formed of a silicon compound is deposited on a silicon substrate 301. The elastic thin layer 303 may be formed of silicon oxide, such as $SiO_2$, or a silicon nitride, such as $SiN_X$. The elastic thin layer 303 is a portion of the silicon substrate 301, which remains unetched when a bottom surface of the silicon substrate 301 is etched.

After that, a lower electrode layer 305 and a piezoelectric device are formed on the elastic thin layer 303. The lower electrode layer 305 transmits an electrical signal to the bottom of the piezoelectric device to induce the deformation of the piezoelectric device. The lower electrode layer 305 is a conductive layer formed of a metal, such as Al, Au, Pt, W, or Ag. Also, the piezoelectric device 303, which is one of the most essential portions of the piezoelectric microspeaker, is formed of a material that converts the received electrical signal into a physical oscillation signal that changes energy. The piezoelectric device 303 may have as high a piezoelectric strain coefficient as possible. For example, the piezoelectric device 303 may be formed of PMN-PT, PZT, PVDF, ZnO, AlN, or a lead-free piezoelectric material. After the piezoelectric device is formed, an upper electrode layer 309 is formed on the piezoelectric device. The upper electrode layer 309 transmits an electrical signal to the piezoelectric device along with the lower electrode layer 305. Subsequently, an insulating layer 311 is formed to electrically insulate the upper electrode layer 309 from the lower electrode layer 305, and each electrode layer is connected to upper and lower electrodes 313.

After that, a lower portion of the silicon substrate 301 is etched (refer to 315). As shown in FIG. 3, a resonance change unit 317 is left unlike in conventional methods. In order to leave the resonance change unit 317, photoresist is transferred onto the bottom surface of the silicon substrate 301, and the lower portion of the silicon substrate 301 is etched using a deep reactive ion etching (DRIE) technique or a potassium hydroxide (KOH) wet etching technique. In this case, however, about 30% of the thickness of the silicon substrate 301 is etched nonuniformly. The nonuniformity of the silicon substrate 301 greatly affects the sound quality of the piezoelectric microspeaker. In order to solve this problem, the etching of the silicon substrate 301 may be performed twice or three times. As an example, a twice-performed DRIE process will now be described. A $SiO_2$ layer or a $SiN_X$ layer is deposited on a silicon substrate 301, and photoresist is coated thereon and patterned to form a primary photoresist pattern. The $SiO_2$ layer or $SiN_X$ layer is etched to a desired thickness using the primary photoresist pattern so that the resonance change unit 317 can be formed during the DRIE process. A secondary pattern for forming the resonance change unit 317 is defined, and the silicon substrate 301 is etched to a desired thickness using a DRIE process or an RIE process. Thereafter, the remaining photoresist is removed. A DRIE process is performed using the resultant pattern, thereby finally forming the resonance change unit 317.

However, when the resonance change unit 317 according to the present invention is formed, a difference in etch rate does not greatly affect the sound quality of the piezoelectric microspeaker. This is because the nonuniformity of the silicon substrate 301 may affect not the stiffness of the elastic thin layer 303 but the weight of the elastic thin layer 303.

Figure 4:
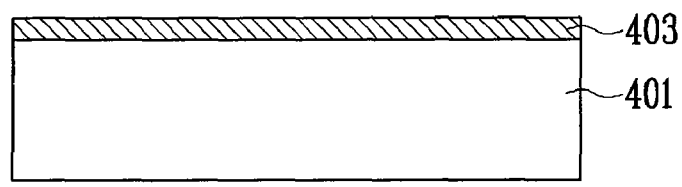
FIG. 4 illustrates a method of manufacturing a piezoelectric microspeaker using an interdigitated electrode according to an exemplary embodiment of the present invention.
Figure 4:
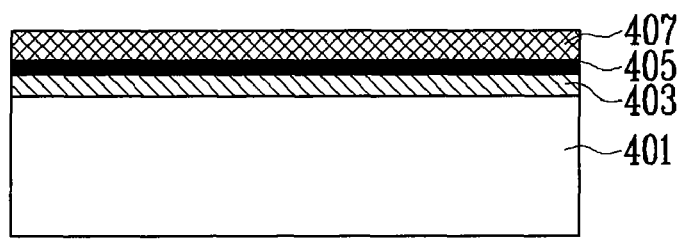
Figure 4:
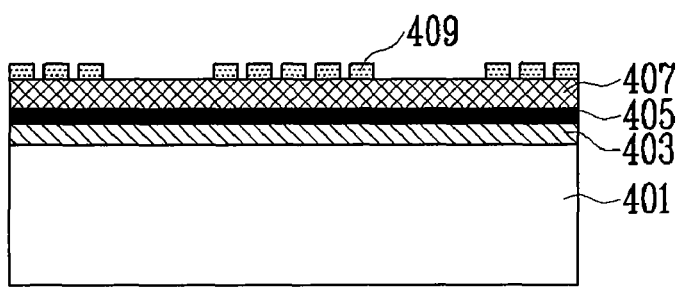
Figure 4:
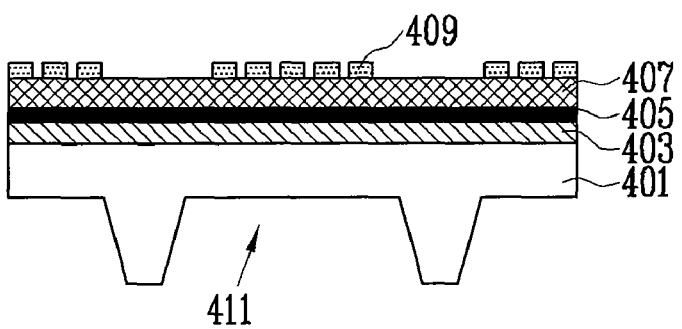
Figure 4:
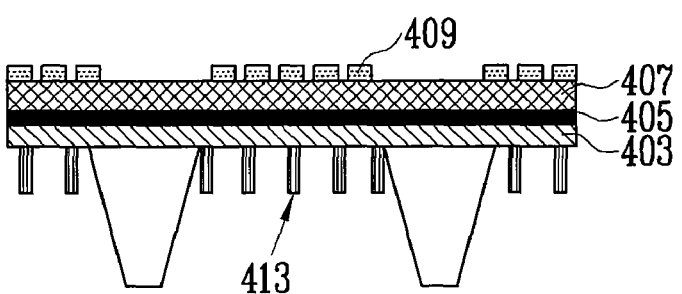

FIG. 4 illustrates a method of manufacturing a piezoelectric microspeaker using an interdigitated electrode according to an exemplary embodiment of the present invention.

Referring to FIG. 4, an elastic thin layer 403 is deposited on a silicon substrate 401. The elastic thin layer 403 may be formed of silicon oxide, such as $SiO_2$, or a silicon nitride, such as $SiN_X$. The elastic thin layer 403 is a portion of the silicon substrate 401, which remains unetched when a bottom surface of the silicon substrate 301 is etched.

Then, an adhesive layer 405 is coated on the elastic thin layer 403, and a piezoelectric layer 407 is bonded onto the adhesive layer 405. In this case, the adhesive layer 405 may be formed of an epoxy adhesive, and the piezoelectric layer 407 may be formed of a single-crystalline piezoelectric material. Alternatively, the piezoelectric layer 407 may be a multiple layer formed of Ti/Pt/PZT/Pt. Alternatively, the formation of the piezoelectric layer 407 may include forming a $ZrO_2$ layer and a layer for forming PZT and then forming a PZT layer or a Pt layer. Here, the PZT is only a typical example of a piezoelectric material, and the present invention is not limited thereto.

After forming the piezoelectric layer 407, an interdigitated electrode 409 is patterned. Thus, the piezoelectric layer 407 oscillates due to the interdigitated electrode 409.

Finally, a lower portion of the silicon substrate 401 is etched (refer to 411). Specifically, photoresist is transferred onto the bottom surface of the silicon substrate 401, and the lower portion of the silicon substrate 401 is etched using a DRIE technique or a KOH wet etching technique. In this case, however, about 30% of the thickness of the silicon substrate 401 is etched nonuniformly. The nonuniformity of the silicon substrate 401 greatly affects the sound quality of the piezoelectric microspeaker. In order to solve this problem, the etching of the silicon substrate 401 may be performed three or four times.

However, when a resonance change unit 413 according to the present invention is formed, a difference in etch rate does not greatly affect the sound quality of the piezoelectric microspeaker. This is because the nonuniformity of the silicon substrate 401 may affect not the stiffness of the elastic thin layer 403 but the weight of the elastic thin layer 403.

As described above, a microspeaker according to the present invention can be easy to manufacture, reduce an abrupt fluctuation of a power output, lower a power output volume, and minimize noise caused by a resonance frequency.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A piezoelectric microspeaker using microelectromechanical systems (MEMS), comprising:
   a piezoelectric layer disposed on an elastic thin layer; and
   a resonance change unit patterned on one of a bottom surface of the elastic thin layer and a top surface of the piezoelectric layer.

2. The piezoelectric microspeaker according to claim 1, wherein the elastic thin layer is formed of one selected from the group consisting of silicon, silicon oxide, and silicon nitride.

3. The piezoelectric microspeaker according to claim 1, wherein the piezoelectric layer is bonded to the elastic thin layer using an epoxy adhesive or deposited on the elastic thin layer using a sol-gel technique.

4. The piezoelectric microspeaker according to claim 1, wherein the piezoelectric layer is a single layer formed of one selected from the group consisting of PZT, PMN-PT, PVDF, ZnO, AlN, and a lead-free piezoelectric material.

5. The piezoelectric microspeaker according to claim 1, wherein the piezoelectric layer is formed in a multiple-layer structure including a Ti layer, a Pt layer, a PZT layer, and a Pt layer.

6. The piezoelectric microspeaker according to claim 1, wherein the resonance change unit disposed under the elastic thin layer is patterned by etching a Si layer formed under the elastic thin layer.

7. The piezoelectric microspeaker according to claim 1, wherein the resonance change unit is patterned in order to change a resonance frequency caused by the piezoelectric layer from an audible frequency band to an inaudible frequency band.

8. The piezoelectric microspeaker according to claim 6, wherein the resonance change unit is patterned using one of a deep reactive ion etching (DRIE) dry etching technique and an anisotropic Si etching technique.

9. A method of manufacturing a piezoelectric microspeaker using microelectromechanical systems (MEMS), comprising:

forming an elastic thin layer, a piezoelectric layer, and an electrode over a first surface of a silicon substrate; and forming a pattern over a second surface of the silicon substrate, the second surface being on an opposing side of the first surface, the pattern being configured to change a resonance frequency.

10. The method according to claim 9, wherein the step of forming the elastic thin layer, the piezoelectric layer, and the electrode comprises:

forming an elastic thin layer over the silicon substrate;
forming a lower electrode over the elastic thin layer;
forming a piezoelectric layer over the lower electrode;
forming an insulating layer over the piezoelectric layer; and
forming an upper electrode over the insulating layer.

11. The method according to claim 9, wherein the step of forming the elastic thin layer, the piezoelectric layer, and the electrode comprises:

forming an elastic thin layer over the silicon substrate;
coating an adhesive on the elastic thin layer;
forming a piezoelectric layer over the coated adhesive; and
forming an interdigitated electrode over the piezoelectric layer.

12. The method according to claim 9, wherein the silicon substrate is etched using one of a deep reactive ion etching (DRIE) dry etching technique and a potassium hydroxide (KOH) wet etching technique in the forming the predetermined pattern.

13. The method according to claim 9, wherein the silicon substrate is patterned at least twice.

* * * * *

UNITED STATES PATENT AND TRADEMARK OFFICE
CERTIFICATE OF CORRECTION

| | |
|---|---|
| PATENT NO. | : 7,812,505 B2 |
| APPLICATION NO. | : 12/240138 |
| DATED | : October 12, 2010 |
| INVENTOR(S) | : Sang Kyun Lee et al. |

It is certified that error appears in the above-identified patent and that said Letters Patent is hereby corrected as shown below:

The information omitted is as follows:

title page, item [30],

| Country | Priority | Priority Date |
|---|---|---|
| Republic of Korea | 2007-126788 | December 7, 2007 |

Signed and Sealed this
Eighth Day of March, 2011

David J. Kappos
*Director of the United States Patent and Trademark Office*